United States Patent [19]
Yin

[11] Patent Number: 5,635,737
[45] Date of Patent: Jun. 3, 1997

[54] SYMMETRICAL MULTI-LAYER METAL LOGIC ARRAY WITH EXTENSION PORTIONS FOR INCREASED GATE DENSITY AND A TESTABILITY AREA

[75] Inventor: Patrick Yin, Fremont, Calif.

[73] Assignee: Aspec Technology, Inc., Sunnyvale, Calif.

[21] Appl. No.: 574,496

[22] Filed: Dec. 19, 1995

Related U.S. Application Data

[63] Continuation of Ser. No. 311,384, Sep. 23, 1994, abandoned.

[51] Int. Cl.$^6$ ............................................. H01L 27/10
[52] U.S. Cl. ........................ 257/204; 257/206; 257/207; 257/208; 257/909
[58] Field of Search .............................. 257/202, 204, 257/206, 207, 211, 758, 909, 208

[56] References Cited

U.S. PATENT DOCUMENTS 5,037,771  8/1991  Lipp ............................................. 437/51
5,384,472  1/1995  Yin ............................................. 257/204

*Primary Examiner*—Minh-loan Tran
*Attorney, Agent, or Firm*—Benman Collins & Sawyer

[57] ABSTRACT

A gate array architecture is disclosed that utilizes significantly less silicon area than the prior art. The core cell includes a four transistor arrangement in which a substrate tap is located adjacent to the transistor pair. This provides for a more "symmetric" cell array than those in the prior art. Through the placement of the taps outside of the transistors the power line connections can be routed in a simple and efficient manner. The architecture includes an extension portion in the contact region of the cell to further reduce wiring complexity. In addition the gate array architecture mirrors pairs of transistor columns to allow for the sharing of substrate taps between pairs of columns. This mirroring feature further reduces routing complexity. The architecture further includes a plurality of probe lines that are located within the architecture to facilitate testability of the outputs of the architecture.

9 Claims, 7 Drawing Sheets

CONVENTIONAL CORE CELL

CONVENTIONAL ARCHITECTURE

SYMMETRICAL MULTI-LAYER METAL LOGIC ARRAY WITH EXTENSION PORTIONS FOR INCREASED GATE DENSITY AND A TESTABILITY AREA

This is a continuation of application Ser. No. 08/311,384, filed Sep. 23, 1994, now abandoned.

FIELD OF THE INVENTION

The present invention relates to a complementary metal-oxide silicon (CMOS) logic gate array and more particularly to a CMOS logic gate array having a plurality of core cells.

BACKGROUND OF THE INVENTION

Gate arrays are used in VLSI integrated circuit chips to implement MOSFET circuits in semiconductor wafers. An MOS gate array consists of an array of MOS transistor sources and drains separated by channels, above which are formed gates to control the conductivity of the channels and thus the state of the transistors. An array of these gates (and their sources and drains) becomes functional only when connected by conductive wiring to appropriate other elements.

Generally, the connecting is accomplished in two steps: a library of macrocells is available to translate simple frequently used logic functions such as NAND, flip-flop, AND, multiplexer, and counter into a gate array wiring pattern, then the macrocells are connected together to form the complex logic functions of the VLSI chip.

Although conceptually there are two steps, the actual metallization to accomplish the two steps is laid out in as few layers as possible, preferably two, so the metal to implement a single macrocell and the metal to connect macrocells to each other is in the same metallization layers. Therefore if an area in a metal layer is used for connecting points within a macrocell, it is not also available for connecting macrocells to each other.

There has been considerable interest in implementing complex logic operations on smaller areas of semiconductor material, while simultaneously retaining the flexibility provided by a gate array in which identical structural units or core cells repeat throughout a large portion of the semiconductor area. A gate array structure consists generally of a base array of many active areas which can be fabricated as a standard product on which is formed one or more "personality layers" comprising conductive material to interconnect the active areas into a desired logical structure.

The personality layers reflect the function or functions to be implemented by the finished array. A given base array can be used to implement many different functions by appropriately designing the personality layers. Thus a gate array allows many different logic functions to be implemented using the same base array. The geometry of the base array cell affects the ability of the designer using later metallization to achieve a final product having maximum density and performance.

One prior art layout of a CMOS logic array required dedicated routing channels that are positioned in between pairs of columns of active areas. Typically, each routing channel contains space for a fixed number of leads, i.e. routing tracks, which run on top of oxide isolation regions formed between the pairs of columns. To promote standardization and flexibility in implementing multiple functions within one substrate layout, generally the same number of routing tracks are allocated to each routing channel within the array.

An improvement on this type of prior art array is shown in U.S. Pat. No. 4,884,118 entitled, Double Metal HCMOS Compacted Array, assigned to LSI Logic Corporation. In this embodiment, active areas are arranged in adjacent columns of alternating conductivity types with no intervening area allocated for metal routing. The placement of alternating conductivity type columns allows for the formation of CMOS type devices in which the P-type regions are on either the right or left sides of the devices depending upon the needs of the circuit.

Thus, in a CMOS circuit application, if some substrate area must be left unused in order to allow for the most efficient placement of routing channels, less substrate area need be wasted in the overall layout since the next CMOS device may begin at the next column either n-type or p-type whichever is available.

This prior art method has a high flexibility of circuit design by allowing increments of a single column to be dedicated to routing. This core array design however, has the disadvantage of requiring a symmetrical array, that is, a p channel lying adjacent to an n-channel. This disadvantage manifests itself in several ways. A gate array using the prior art structure described in the above mentioned patent requires at least one contact point that is dedicated to the connection of the substrate taps between the active areas.

In addition to the alternating nature of the active regions, there is a distinct possibility that there has to be extensive routing of the wires in the integrated circuit when providing the personality layer to provide the desired logical structure described in the above-mentioned patent.

The type of logic array described in the above mentioned patent has a core cell of eight transistors which include two substrate taps therebetween. Typically in the prior art cell described in the above mentioned patent, what is shown is an active area with a first pair of p-channel transistors on one side, a second pair of p-channel transistors on a second side and a substrate tap therebetween. This prior art cell includes a second active area with a first pair of n-channel transistors on one side, a second pair of n-channel transistor on a second side and a substrate tap therebetween. The substrate taps provide the P-channel and N-channel substrate with a voltage potential.

The disadvantage of the substrate tap being between p or n channel transistors is gate density (i.e. number of gates per sq.mm). The diffusion spacing between the substrate taps and transistor diffusion is greater than that of the polysilicon. Secondly, the alternating configuration is inefficient at the chip level in random access memory (RAM) or read-only memory (ROM) implementations when the layout is a complex bus structure.

Typically this type of cell is utilized to provide multiple columns of active areas to provide the gate array architecture. This cell has the further disadvantage of requiring the jumping of a column when connections must be made between columns of the same conductivity type. For example in the case when two p-channel and one n-channel are used to form a cell i.e. p-p-n, the p-channel has half the speed of an n-channel and two p-channel will give a more balanced propagation delay. This adds significant complexity to the routing of these connections. Finally due to the alternating nature of the columns and position of the substrate tap (between the transistors), routing of the voltage potential lines and other metal connections can also become quite complex.

Often times, testability is also a problem in such devices. That is, often times it is difficult to test all of the outputs of the gate array. There are known boundary scan techniques that are relatively complex. Typically in such gate array architectures, such boundary scan techniques are not cost effective for many applications The present invention overcomes the above-mentioned problems with testability and density problems with gate array cells. In addition, the gate array geometry of the present invention accommodates an optimum circuit layout with minimum waste of silicon area and also accommodates efficient implementation of the personality layers required for the desired logical design.

SUMMARY OF THE INVENTION

A gate array is provided that comprises a four transistor basic core cell. This array allows for a more symmetric design than previously known gate array structures. The four transistor core cell is accomplished by placing a substrate-tap outside of the transistor pairs rather than between them as is shown in the prior art. The gate array includes a testability area. The testability area includes a plurality of probe lines located between the transistor pairs. The probe lines further include pad members to facilitate testing of the outputs of the gate array. In addition, an extension portion is included which is part of a contact point region within an active area of the cell for facilitating routing of power and ground connections and for facilitating connections to other cell regions within the gate array architecture.

Finally, through this type of gate array structure, higher useable gate density is expected with additional routing layers than when utilizing previously known gate arrays. The above-mentioned improvement is obtained due to the increased symmetry of the cell.

DETAILED DESCRIPTION

The present invention relates to an improvement in gate array technology. The following description is presented to enable one of ordinary skill in the art to make and use the invention and is provided in the context of a patent application and its requirements. Various modifications to the preferred embodiment will be readily apparent to those skilled in the art, and the generic principles defined herein may be applied to other embodiments. Thus, the present invention is not intended to be limited to the embodiment shown, but is to be accorded the widest scope consistent with the principles and features described herein.

Figure 1:
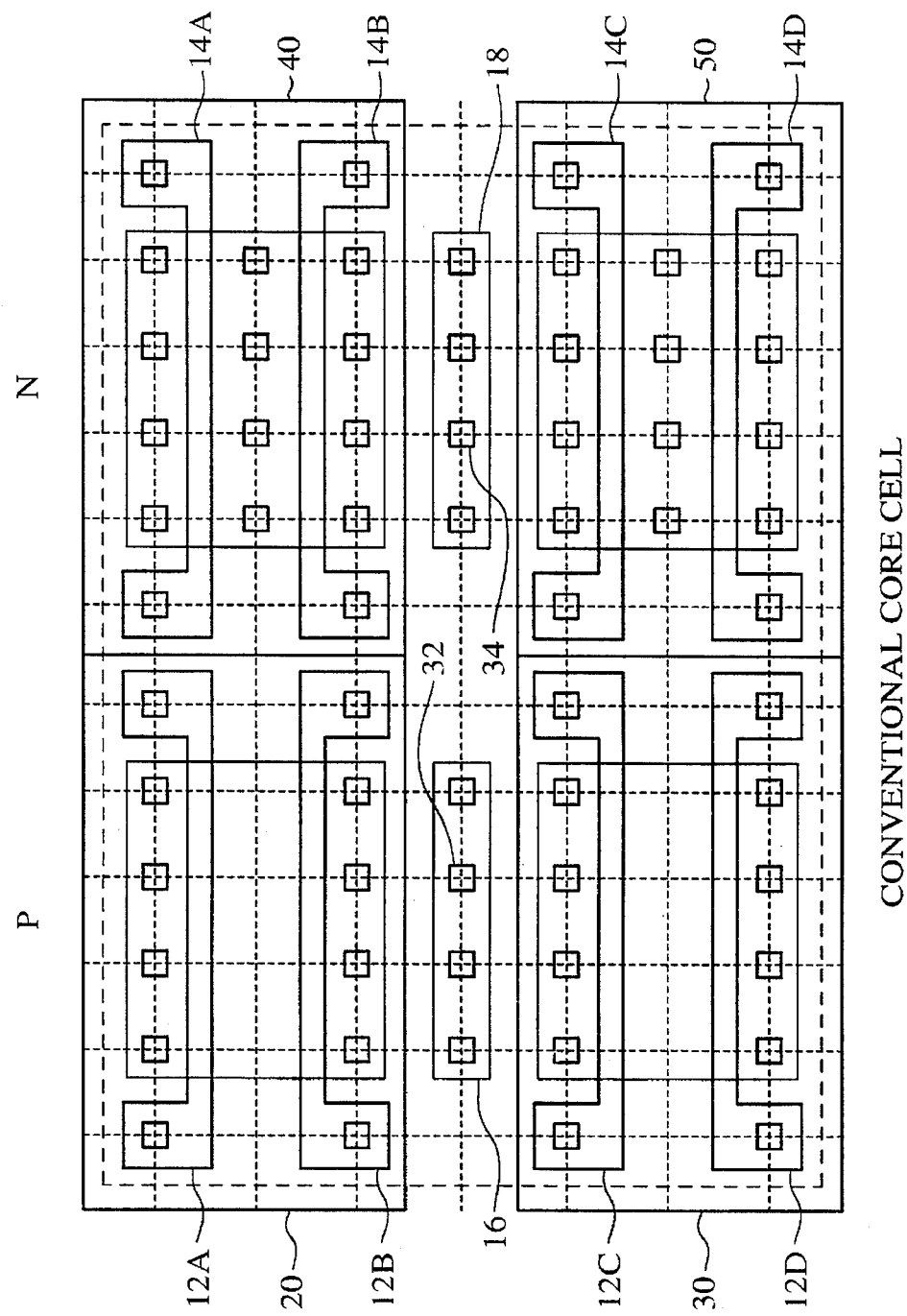
FIG. 1 is a diagram of a conventional core cell for a gate array.

FIG. 1 shows in detail four active areas which comprise eight transistors and the associated substrate taps for the active areas. In the area bounded by 20 is an active area which comprises two p-type transistors 12a and 12b. In the area bounded by 30 is an active area which comprises p-type transistors 12c and 12d.

In the area bounded by block 40 is an active area which comprises n-type transistor 14a and 14b. In the area bounded by 50 is an active area which comprises n-type transistors 14c and 14d.

Each of the transistors 12a–12d and 14a–14d include a source, drain and gate regions for controlling the flow of current therebetween. Also between active areas 20 and 30 is substrate tap 16 and between active areas 40 and 50 is substrate tap 18. These substrate taps 16 and 18 are utilized for providing the voltage bias to the transistors 12a–d and 14a–d, respectively. It is known that the substrate taps 16 and 18 are doped with opposite material to the column it is associated with. In this type of cell four contact points 32, 34 are utilized on each of the substrate taps 16 and 18 respectively to provide for proper electrical contact between the substrate taps and the first metal layer power bus.

In this arrangement even though there is some symmetry between the active areas 20,30 and 40,50 because the substrate taps 16, 18 are located within the active areas, there is a loss of symmetry when the adjacent transistors are used for designing logical circuits. In addition this cell requires that one of the contact points 32,34 be dedicated to allow for electrical contact between the taps and the power bus. This common contact point 32,34 ensures that the voltage potential is the same for all of the taps 16,18.

The other less obvious disadvantage of this cell is the asymmetry created by virtue of the position of the substrate tap. For example when a macrocell uses an odd number of gates (each gate comprises $2n$ and $2p$ transistors) there are two possible versions of this cell. For example, one version includes a substrate tap located on the left side of the macrocell and one version includes a substrate tap located on the right side of the macrocell. The requirement of having an extra version will demand that the cell library be larger. Hence, more effort will be required to maintain the library.

Figure 2:
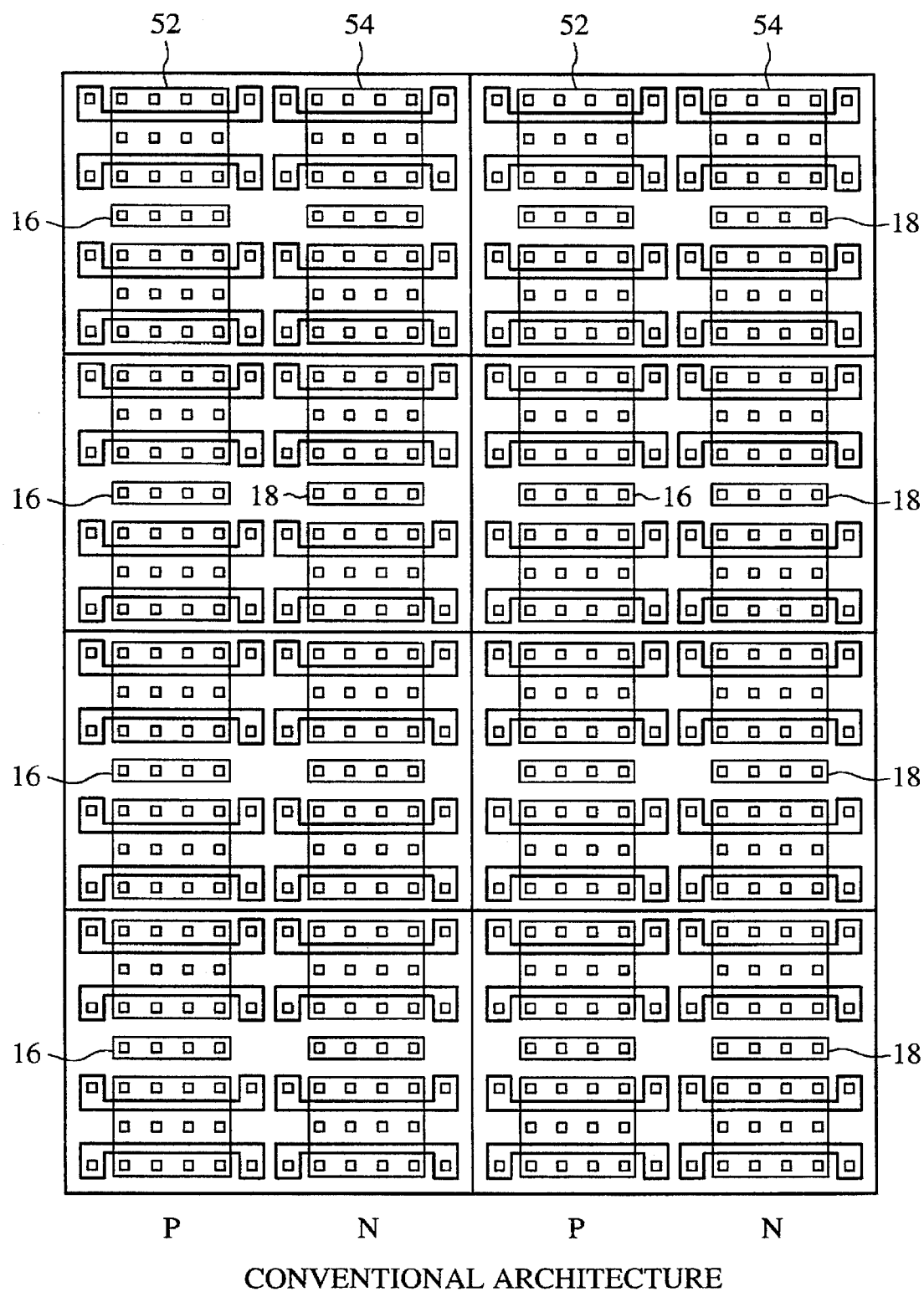
FIG. 2 is conventional gate array architecture using the core cell of FIG. 1.

In addition, as has been above mentioned testability is a problem in such a cell. In such cells, it is impossible to test all of the outputs of the gate array. To illustrate the problems with testability and asymmetry, refer now to FIG. 2. What is shown is a diagram of a gate array architecture 50 utilizing a plurality of cells 10 of FIG. 1. The architecture 50 includes a plurality of alternating p-channel 52 and n-type 54 active areas. Each of these regions are made up of the core cells 10 shown in the prior art of FIG. 1. In this architecture the n-channel and p-channel active areas alternate to provide a gate array structure 50 in accordance with the prior art. As has been before mentioned this type of arrangement lends itself to gate density problems due to the location of the substrate taps 16,18.

With this type of architecture oftentimes if two different p-channel active areas need to be connected for more balanced delay characteristics it may be necessary to skip a region due to the alternating nature of the active areas or more likely less efficient layout occurs by not using some of the n-channel devices. When making interconnections using this type of arrangement the wiring patterns and testability points can become quite inefficient. All of these problems taken together can significantly increase the size of the gate array circuit when designing the personality layers for the gate array architecture.

Figure 3:
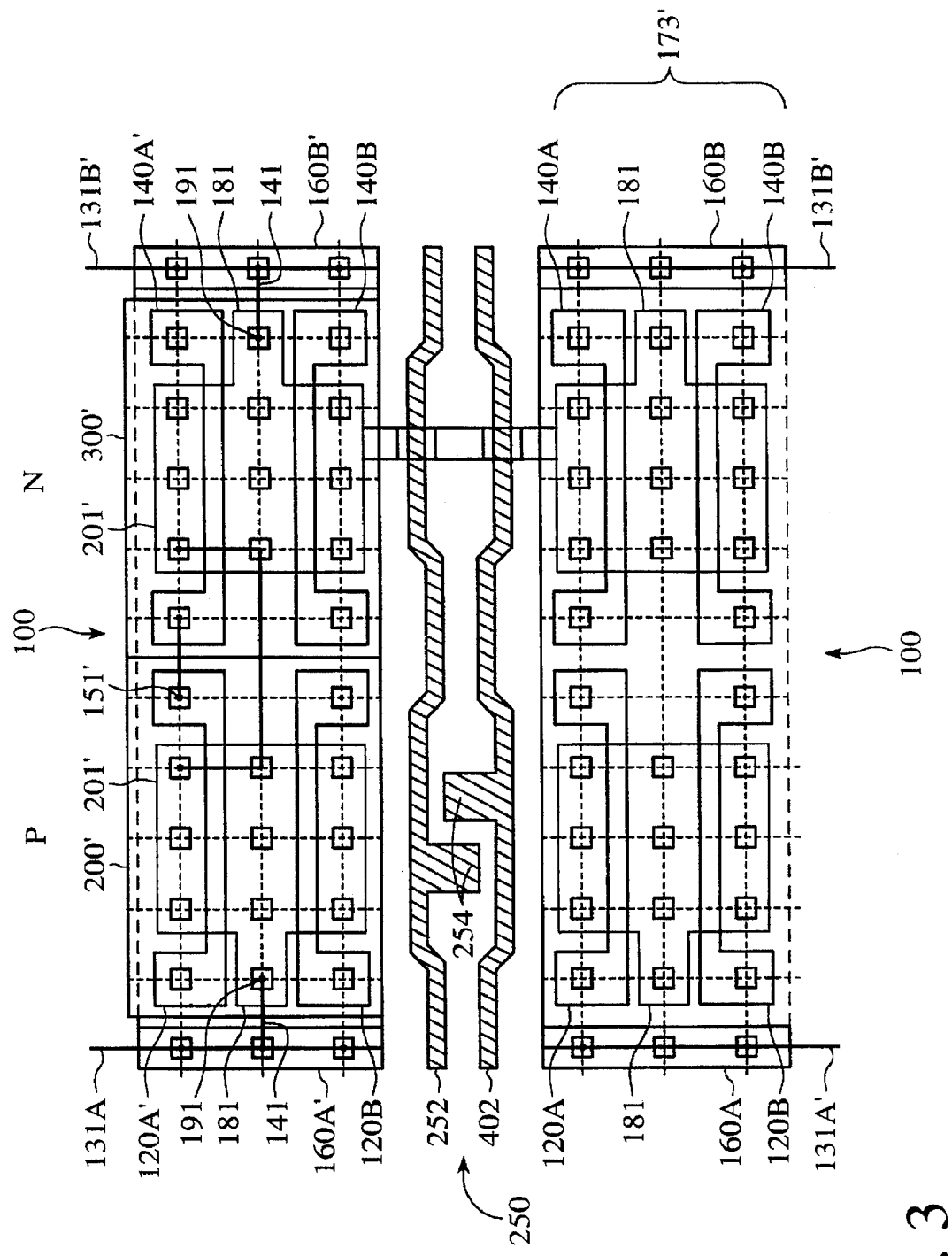
FIG. 3 is a diagram of a gate array structure including a testability area.

In FIG. 3, what is shown is a diagram of a gate array structure 150 that has more symmetry than the cell 10 shown in FIG. 1. This gate array structure 150 in this embodiment includes two core cells 100. In addition, this gate array structure 150 includes a testability area 250. In this embodiment, each of the core cells 100 includes four transistors 120a–b and 140a–b rather than the eight required in the prior art cell 10 of FIG. 1.

In this embodiment, the area bounded by 200 is an active area which comprises two p-type transistors 120a–120b. The area bounded by 300 is an active area which comprises two n-channel transistors 140a–b. Each of the transistors 120a–b and 140a–b include a source drain and gate region for controlling the flow of current therebetween. The active areas 200 and 300 include a contact point region 201 which in this embodiment is within the two p-type and n-channel transistors respectively. In this embodiment, the substrate taps 160a–b are located adjacent to their associated transistor pair. Hence, the substrate taps 160a–b are not an integral part of the routing area of the core cell as in the prior art cell of FIG. 1. Since the taps 160a–b are outside of the routing area the power line which connects the substrate taps as well as the source region of the transistor runs on the top the substrate taps. Hence, in this embodiment only three contact points are needed in the contact point region 201 unlike the four contact points required in the prior art cell.

Each of the core cells 100 includes an extension portion 181 which has an additional contact point 191 within the contact point region 201 which will facilitate connection via lines 141 directly to the associated substrate tap without affecting connections to other regions of the structure. More specifically in this embodiment, the contact points shown by designation 173' can now be utilized for other purposes.

In this embodiment, the extension portion 181 is part of the contact region 201' and projects outwardly such that the connection to the contact point 191' will not interfere with any other of the connections to active areas 200' and 300' of the cell. The extension portion 181 is substantially adjacent to the end portions of the transistors 120A and 120B and 140A and 140B respectively. This extension portion 181 provides an additional contact point which improves cell routability. In other words, cells can now be designed more efficiently which will in turn lead to an improvement in gate utilization. Hence, as above mentioned, the contact points shown at region 173 can be utilized for other purposes.

Through the use of the extension portion 181 a more dense structure is provided since power or ground line connections can be made from the contact point region 191 without affecting the connections within the internal architecture as has been necessary in prior art gate array cells. This core cell 100 has the further advantage of having increased density due to the mirroring arrangement thereby providing a more efficient architecture than those previously known.

The core cell 100 has been disclosed in U.S. patent application Ser. No. 08/112,899 entitled "Symmetrical Multi-Layer Metal Logic Array With Continuous Substrate Taps and Extension Portions for Increased Gate Density", assigned to the assignee of the present application and is incorporated by reference in its entirety herein.

In this embodiment, testability area 250 is located between the active areas of the two cells 100. The testability area 250 comprises a probe line 252 which runs between the active areas of the cells 100. Pad members 254 are coupled to the probe lines 252 to facilitate connection to the output. The pad members 254 are utilized to enable a write to a particular logical circuit formed by the core cell 100. Testability areas have been utilized in other circuit environments and have been implemented by such companies as Cross-Check Corporation. However, these known testability areas have not been utilized in conjunction with an above-described gate array structure to provide optimum density and also provide easy testability.

Figure 4:
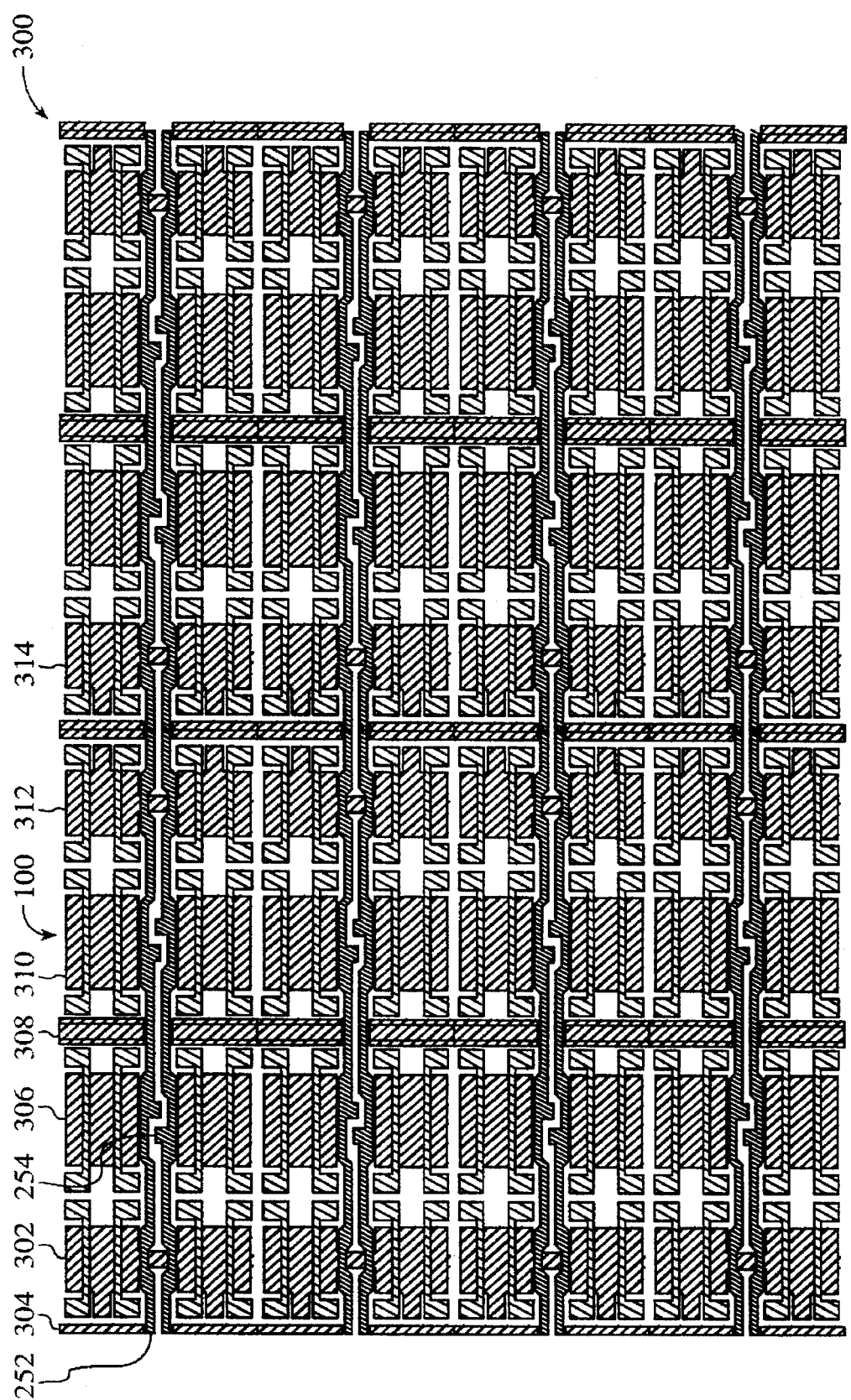
FIG. 4 is a diagram of a gate array architecture utilizing the gate array structure of FIG. 3.

Referring now to FIG. 4, shown is a gate array architecture 300 that utilizes the gate array structure 150 of the present invention. As is seen the architecture 300 includes a first p-channel column 302 and a plurality of substrate taps 304. On the other side of the p-channel column 302 is an n-channel column 306. Adjacent to the n-channel column 306 is another plurality of substrate taps 308. P-channel column 302 and n-channel column 306 comprise a first transistor column pair.

Adjacent to the strip of substrate taps 308 is an n-channel column 310. Adjacent to the n-channel column 310 is a p-channel column 312. N-channel column 310 and p-channel column 312 comprise a second transistor column pair.

As is readily apparent instead of the alternating arrangement shown in the prior art, pairs of n-p channel columns are mirrored with the adjacent p-n column pair. This mirror arrangement provides two advantages, firstly the power lines are routed outside the active areas on the group of substrate taps that run the length of the active areas. Therefore the routing problems associated with substrate taps being within the core cells known in the prior art are avoided.

An additional advantage of this mirror arrangement is that the common columns can share substrate taps. For example in this embodiment the two n-channel columns 306 and 310 can share substrate taps 308. The mirror arrangement will further reduce routing difficulty when providing the personality layer for the gate arrays.

Another advantage of this type of architecture is that the mirroring of the n-p column pairs allows for direct connections between adjacent regions of the same type. Hence unlike the prior art architectures, the architecture 300 of the present invention reduces the need for complex routing schemes when making connections across common active areas.

As has been before mentioned, the gate array architecture 300 includes the testability area 250 which is located between the core cells 100 of the architecture 300. A plurality of probe lines 252 are located between the core cells 100. As also has been before mentioned, the pad members 254 are utilized to enable a write to a particular circuit in the architecture 300.

Figure 5:
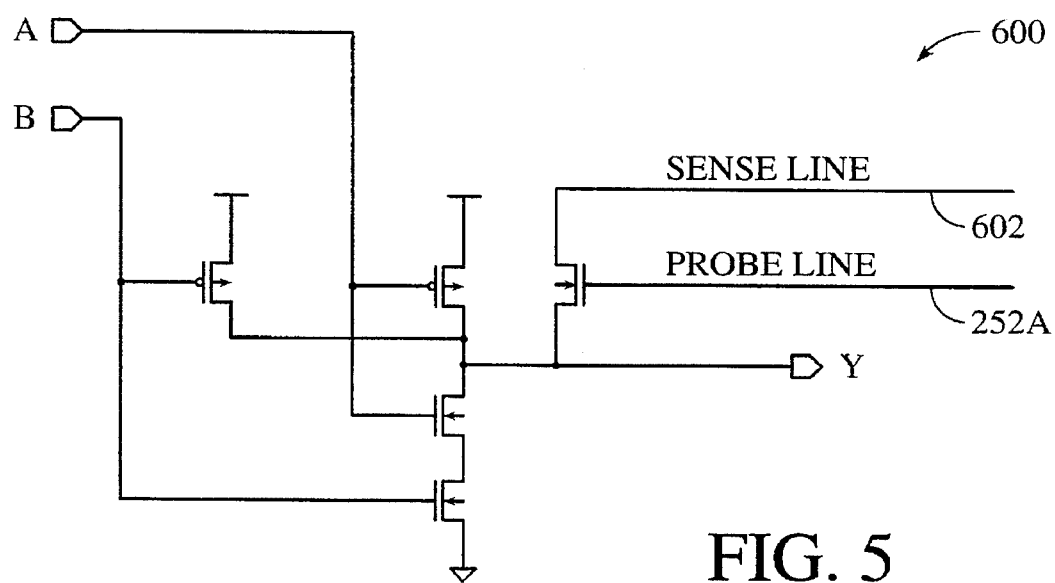
FIG. 5 is a circuit diagram of a two input NAND gate utilizing the gate array structure of the present invention.
Figure 6:
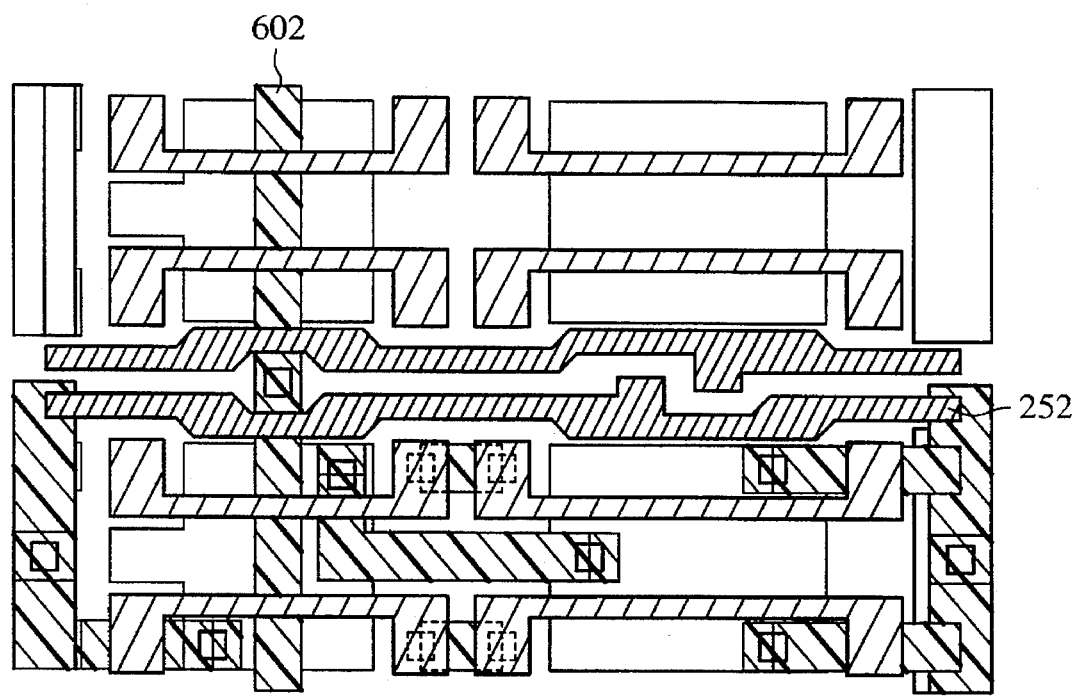
FIG. 6 is a gate array diagram of the two input NAND gate of FIG. 5.

To describe this feature in the context of a particular circuit, refer now to FIGS. 5 and 6 which show a circuit diagram and a gate array representation, respectively, of a two input NAND gate 600 that utilizes the architecture 300. As is seen the probe line 252A is used to connect the output 604 to sense 602 when probe line 252A is active.

Figure 7:
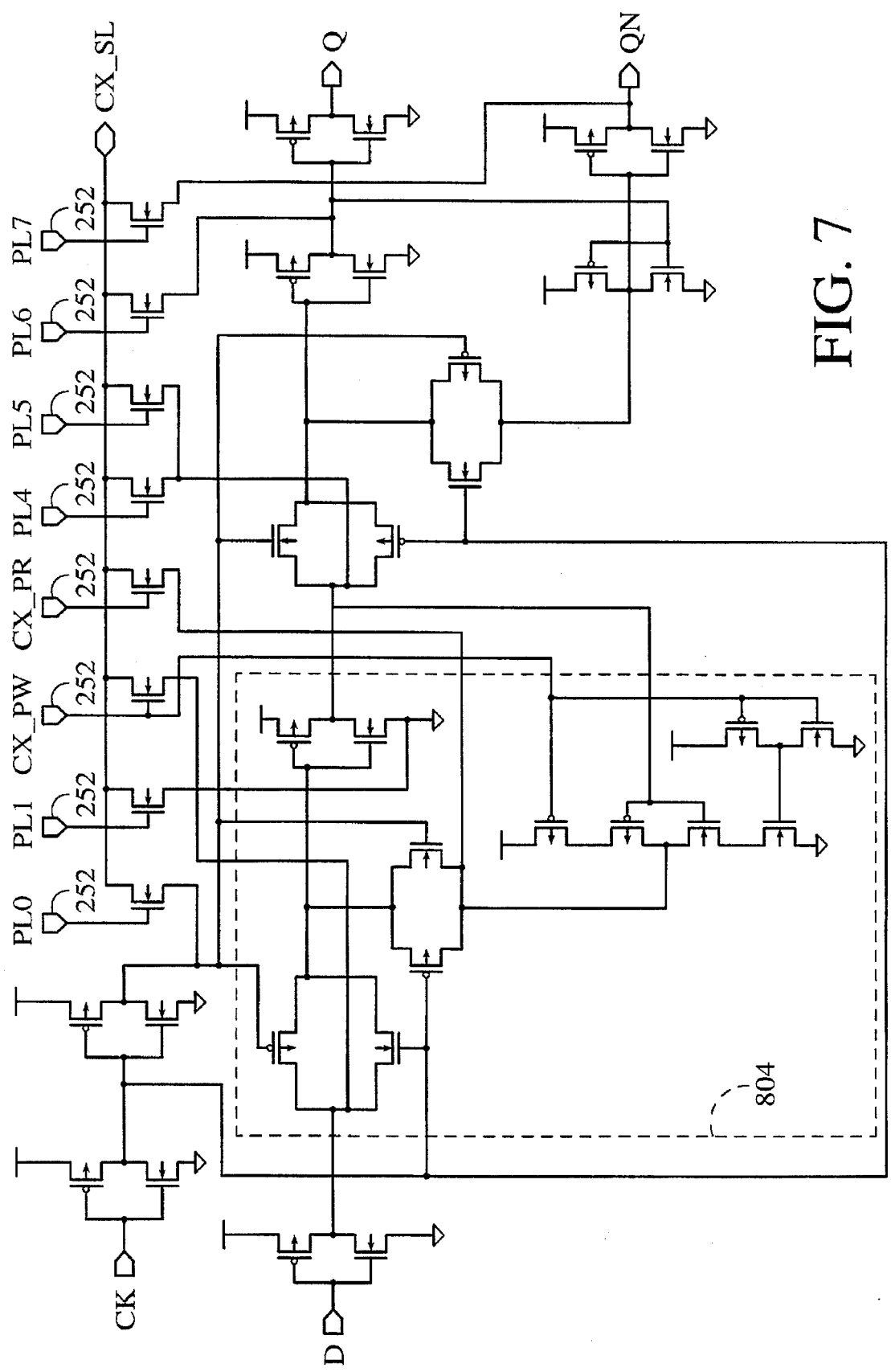
FIG. 7 is a circuit diagram of a flip-flop circuit utilizing the gate array structure of the present invention.
Figure 8:
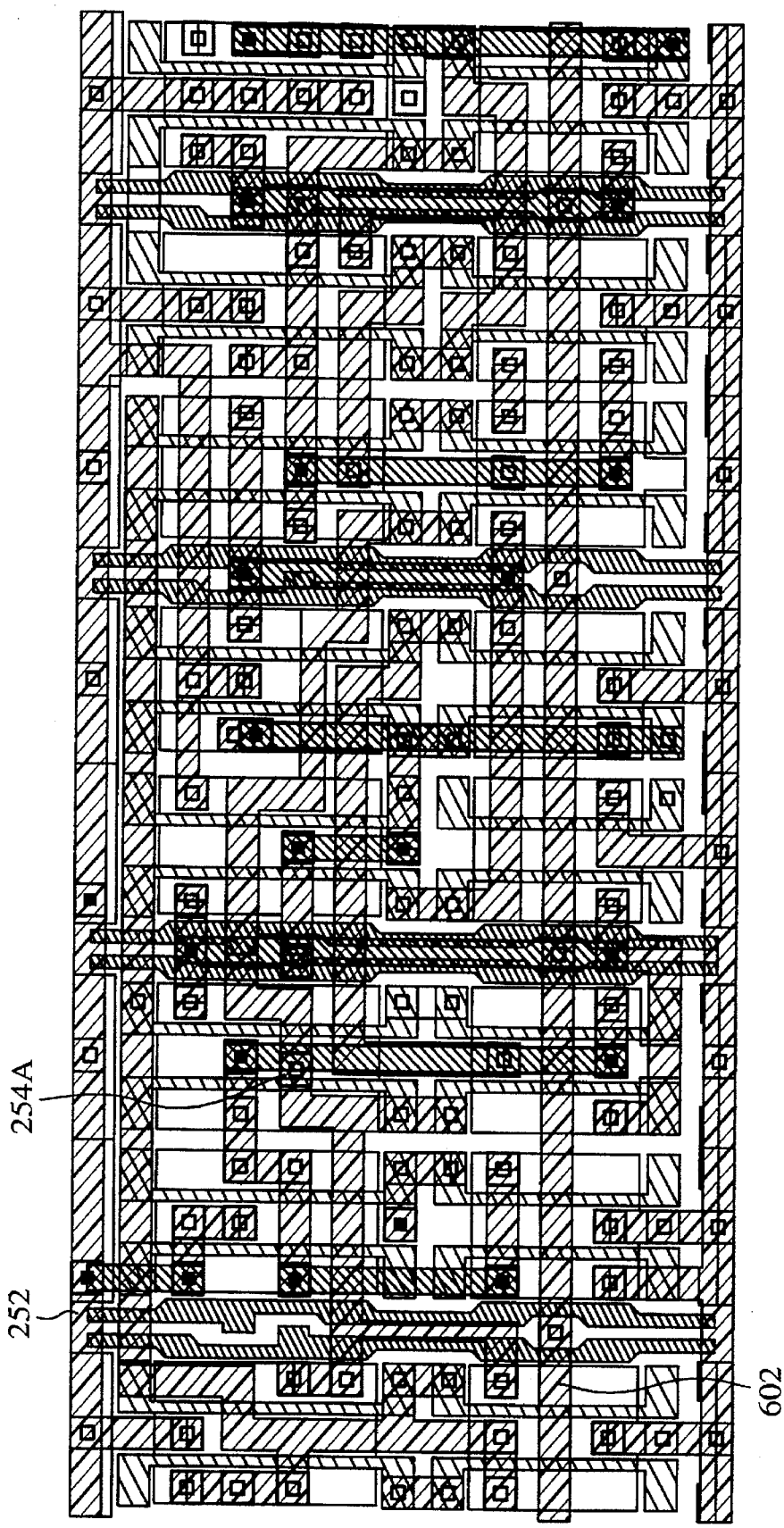
FIG. 8 is a gate array diagram of a flip-flop circuit of FIG. 7.

Pad members 254, as has been before-mentioned, are utilized to provide a contact point for connecting the probe line 252 to an internal circuit node. The probe line 252 provides the voltage necessary to write data. Refer now to FIGS. 7 and 8 which show a circuit diagram and gate array representation respectively, of a flip-flop circuit 700 that utilizes the architecture 300, this feature is shown to facilitate writing data into the latch 804 of the flip flop 300. In this embodiment, a voltage is applied to probe line 252 and the pad member 254A provides a contact point to an internal circuit node and thereby provides for connection to latch 804. By applying voltage to probe line 252, data can be written into the latch 804 via this connection. Through the provision of the probe lines 252 throughout the architecture 300 of the present invention each of the outputs of a circuit provided in accordance with the present invention can be easily accessed.

Although the present invention has been described in accordance with the embodiment, one of ordinary skill in the art recognizes that there could be variations to the embodiment and those variations would be within the spirit and scope of the present invention. For example, although the present invention has been described in the context of a two input NAND gate and flip flop, one ordinary skill in the art will recognize that a number of logic gates including but not limited to AND gates, multiplexers and converters could be realized utilizing the present invention and their use would be within the spirit and scope of the present invention.

Accordingly many modifications may be made by one of ordinary skill in the art without departing from the spirit and scope of the present invention, the scope of which is defined by the appended claims.

I claim:

1. An integrated circuit gate array structure comprising:

a semiconductor substrate in which are located a plurality of columns of semiconductor material of a first conductivity type and a plurality of columns of semiconductor material of a second conductivity type;

active areas formed within the columns for connecting conductive material, thereby forming active regions, each of the active regions including a contact point region, the contact point region including a plurality of contacts for electrical connection thereto; the contact point region further including an extension portion that allows connection outside the active region without affecting any other connections to the structure;

a testability area comprising a plurality of probe lines located between the active regions, each of the probe lines including a pad member for facilitating connection to the active regions; and a plurality of tap regions formed outside the columns, each of the plurality of tap regions being associated with one pair of the columns, the tap regions being doped with an opposite conductivity with respect to the conductivity of their respective columns thereby allowing current and voltage characteristics of the columns to be controlled.

2. An integrated circuit gate array structure of claim 1 in which a core cell of the gate array structure comprises:

a first pair of transistors within a column of the first conductivity type;

a second pair of transistors within a column of the second conductivity type; and a substrate tap within one of the tap regions located adjacent to either the first or second pair of transistors.

3. An integrated circuit gate array structure comprising:

a semiconductor substrate in which are located a plurality of columns of semiconductor material of a first conductivity type and a plurality of columns of semiconductor material of a second conductivity type; the substrate having one of the first and second plurality of columns adjacent to each other and mirroring the next pair of columns such that the conductivity of the first column of the next pair of columns is the same as the last column of the first pair of columns;

active areas formed within the columns for connecting conductive material, thereby forming active regions, each of the active regions including a contact point region, the contact point region including an extension portion that allows connection outside the active region without affecting any other connections to the structure;

a testability area comprising a plurality of probe lines located between the active regions, each of the probe lines including a pad member for facilitating connection to the active regions; and a plurality of tap regions formed outside the columns, each of the plurality of tap regions being associated with one pair of the columns, the plurality of tap regions having the opposite conductivity with respect to the conductivity of the columns to which they are adjacent and allowing connection of conductive material, the tap regions being doped with an opposite conductivity with respect to the conductivity of their respective columns thereby allowing current and voltage characteristics of the columns to be controlled;

wherein the active areas and the tap regions adjacent to one of the columns are placed so as to form a plurality of adjacent cells, each cell comprising a first active area with an associated tap region located adjacent thereto and wherein pairs of columns are situated to allow common conductivity columns to share tap regions.

4. The gate array structure of claim 3 in which the extension portion includes a contact.

5. The gate array structure of claim 4 in which the contact of the extension portion is substantially adjacent to an end of the active area so as to facilitate connection of the contact to a tap region and to other regions within the structure.

6. An integrated circuit gate array structure of claim 3 in which a core cell of the gate array structure comprises:

a first pair of transistors within a column of the first conductivity type, a second pair of transistors within a column of the second conductivity type, and a substrate tap within one of the tap regions located adjacent to either the first or second pair of transistors.

7. An integrated circuit gate array structure comprising:

a semiconductor substrate in which are located a plurality of columns of p-channel semiconductor material, the substrate having one of the plurality of p-channel columns adjacent to an n-channel column to form a first column pair, the substrate further having a next pair of columns positioned such that the next pair of columns mirror the first column pair such that the conductivity of the first column of the next pair of columns is the same as the last column of the first column pair;

active areas formed within the columns for connecting conductive material, thereby forming active regions, each of the active regions including a contact point region, the contact point region including an extension portion that allows connection outside the active region without affecting any other connections to the structure;

a testability area comprising a plurality of probe lines located between the active regions, each of the probe lines including a pad member for facilitating connection to the active regions; and a plurality of tap regions formed outside the column pairs, each of the plurality of tap regions being associated with one column pair, each of the tap regions having the opposite conductivity with respect to the conductivity of the columns to which they are adjacent thereby allowing connection of conductive material, and further being heavily doped thereby allowing current and voltage characteristics of the columns to be controlled, wherein the active areas and the tap regions adjacent to one of the columns are placed so as to form a plurality of adjacent cells, each cell comprising a first active area with an associated tap region located adjacent thereto and a second active area and an associated tap region adjacent thereto and wherein pairs of columns are situated to allow common conductivity columns to share tap regions.

8. The gate array structure of claim 7 in which the extension portion includes a contact.

9. The gate array structure of claim 8 in which the contact on the extension portion is substantially adjacent to an end of the active area so as to facilitate connection of the contact to a tap region.

\* \* \* \* \*